(12) United States Patent
Liu et al.

(10) Patent No.: US 7,741,658 B2
(45) Date of Patent: Jun. 22, 2010

(54) SELF-ALIGNED SUPER STRESSED PFET

(75) Inventors: Yaocheng Liu, Elmsford, NY (US);
Zhijiong Luo, Carmel, NY (US);
Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 11/842,437

(22) Filed: Aug. 21, 2007

(65) Prior Publication Data

US 2009/0050942 A1 Feb. 26, 2009

(51) Int. Cl.
*H01L 31/0328* (2006.01)

(52) U.S. Cl. .................... 257/192; 257/616; 257/77

(58) Field of Classification Search ............... 257/192, 257/616, 77
See application file for complete search history.

(56) References Cited

U.S. PATENT DOCUMENTS

| | | | |
|---|---|---|---|
| 6,492,216 B1 | 12/2002 | Yeo et al. | |
| 6,844,227 B2 | 1/2005 | Kubo et al. | |
| 6,927,414 B2 | 8/2005 | Ouyang et al. | |
| 7,118,973 B1 * | 10/2006 | Naem | 438/285 |
| 7,138,292 B2 | 11/2006 | Mirabedini et al. | |
| 7,166,897 B2 | 1/2007 | Orlowski et al. | |
| 2005/0023520 A1 | 2/2005 | Lee et al. | |
| 2007/0045729 A1 | 3/2007 | Hoentschel et al. | |

* cited by examiner

*Primary Examiner*—Mark Prenty
(74) *Attorney, Agent, or Firm*—Gibb I.P. Law Firm, LLC (57) ABSTRACT

The embodiments of the invention comprise a self-aligned super stressed p-type field effect transistor (PFET). More specifically, a field effect transistor comprises a channel region comprising N-doped material and a gate above the channel region. The field effect transistor also includes a source region on a first side of the channel region and a drain region on a second side of the channel region opposite the first side. The source and drain regions each comprise silicon germanium, wherein the silicon germanium has structural indicia of epitaxial growth.

12 Claims, 14 Drawing Sheets

SELF-ALIGNED SUPER STRESSED PFET

BACKGROUND

1. Field of the Invention

The embodiments of the invention comprise a self-aligned super stressed p-type field effect transistor (PFET).

2. Description of the Related Art

Strain engineering has become the main method to drive device performance in recent complementary metal oxide semiconductor (CMOS) technology generations. Carbon-doped silicon (Si:C), which has a smaller lattice constant than silicon, can insert compressive strain in the PFET channel when a layer of carbon-doped silicon is put directly under the PFET channel regain. On the other hand, silicon germanium (SiGe) which has a larger lattice constant than silicon also can insert compressive strain in the PFET channel when it is epitaxially grown in source and drain regions. Moreover, carbon-doped silicon can help reduce B diffusion and improve the epitaxial quality of silicon germanium.

SUMMARY

The embodiments of the invention comprise a self-aligned super stressed p-type field effect transistor (PFET). More specifically, a field effect transistor comprises a channel region comprising N-doped material and a gate above the channel region. The field effect transistor also includes a source region on a first side of the channel region and a drain region on a second side of the channel region opposite the first side. The source and drain regions each comprise silicon germanium, wherein the silicon germanium has structural indicia of epitaxial growth.

Furthermore, a silicon-carbon layer is below the channel region, the source region, and the drain region. It is recognized that the silicon-carbon layer can be positioned only below the channel region and not below the source and drain regions. The silicon-carbon layer is thicker below the channel region relative to areas of the silicon-carbon layer below the source and drain regions. Moreover, a thickness of the silicon-carbon layer below the source region is less than a thickness of the silicon germanium of the source region; and, a thickness of the silicon-carbon layer below the drain region is less than a thickness of the silicon germanium of the drain region.

The silicon-carbon layer comprises when viewed in cross-section, an inverted U-shaped structure. More specifically, this includes a horizontal portion, a first vertical portion positioned at a first end of the horizontal portion, and a second vertical portion positioned at a second end of the horizontal portion opposite the first end of the horizontal portion. The first vertical portion and the second vertical portion are positioned below an uppermost surface of the silicon-carbon layer.

In addition, the embodiments of the invention include a method of forming a self-aligned super stressed PFET. The method begins by forming a channel region in a substrate and forming a sacrificial gate stack above the channel region. Next, a silicon-carbon layer is implanted in the substrate below the channel region. This includes performing pre-amorphization implantation of a dopant in the substrate and implanting carbon in the substrate below the channel region. The implanting of the silicon-carbon layer also includes performing solid phase epitaxy of the substrate and a laser anneal of the substrate.

The method also forms a gate above the channel region and forms offset spacers on the gate. Following this, areas of the substrate opposite the channel are removed and a source region and a drain region are epitaxially grown in the areas. The removing of the areas of the substrate opposite the channel can include completely removing silicon-carbon from the areas opposite the channel. Subsequently, spacers are formed above the source and drain regions.

Accordingly, the embodiments of the invention provide self-aligned structures having a carbon-doped silicon layer under the PFET channel and silicon germanium in the recessed source and drain regions. This inserts ultra compressive strain into the PFET channel for device performance improvement. Moreover, the carbon-doped silicon layer can help retard B diffusion, therefore to improve threshold voltage roll-off. Furthermore, the carbon-doped silicon layer can help improve silicon germanium epitaxial quality.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention provide self-aligned structures having a carbon-doped silicon layer under the PFET channel and silicon germanium in the recessed source and drain regions. This inserts ultra compressive strain into the PFET channel for device performance improvement. Moreover, the carbon-doped silicon layer can help retard B diffusion, therefore to improve short channel effects. Furthermore, the carbon-doped silicon layer can help improve silicon germanium epitaxial quality.

Figure 1:
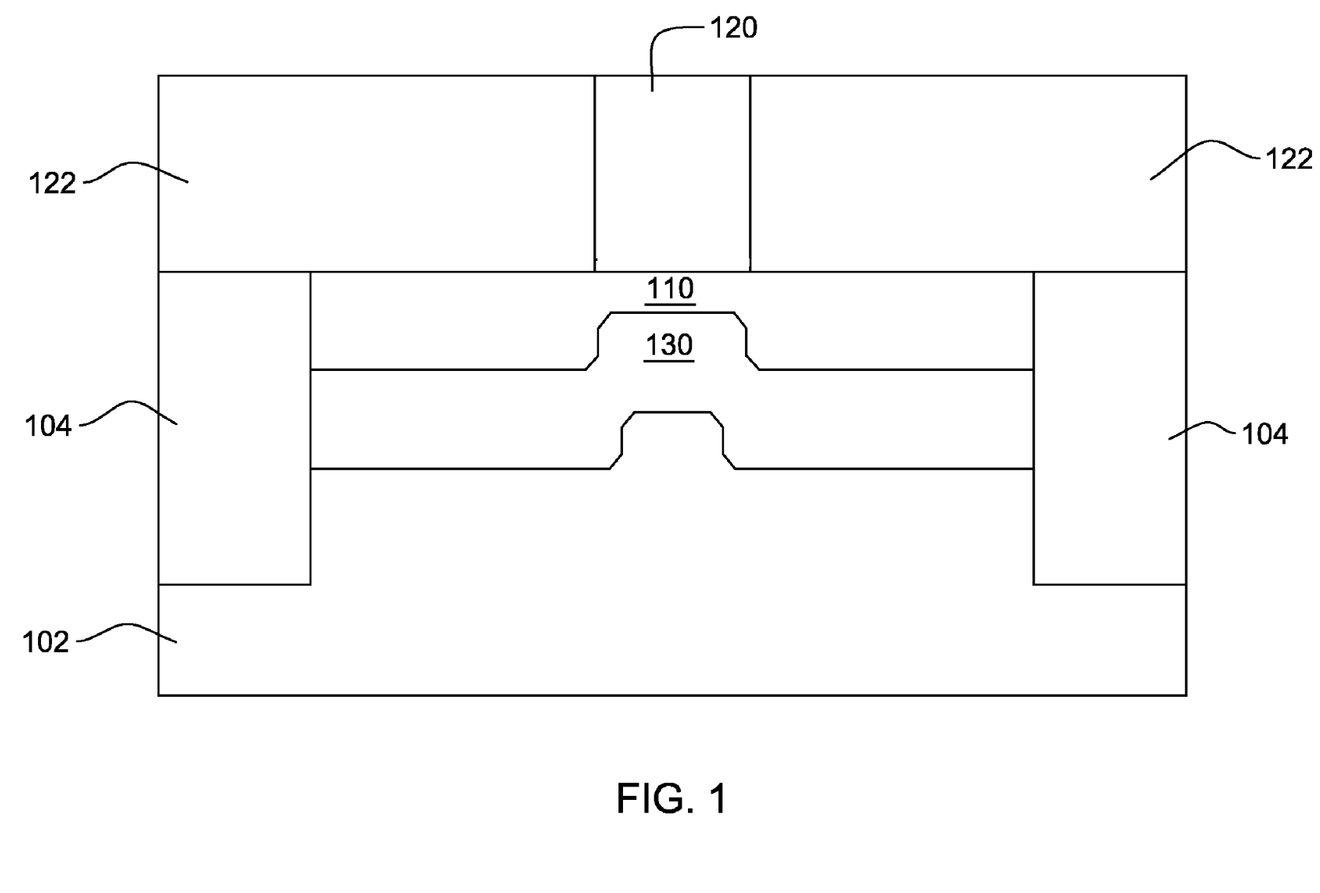
FIG. 1 is a diagram illustrating an incomplete field effect transistor having a sacrificial gate stack and a nitride layer.

As illustrated in FIG. 1, a method of forming a field effect transistor 100 begins by forming STI regions 104 in a substrate 102 (bulk silicon or silicon-on-insulator), wherein a channel region 110 is between the STI regions 104. Next, a sacrificial gate stack 120 is formed above the channel region 110. The method then implants a silicon-carbon layer 130 into the substrate 102. This includes performing a pre-amorphization implantation (PAI) with germanium (Ge), xenon (Xe), silicon (Si), arsenic (As) or other species. The implantation of the silicon-carbon layer also includes implanting carbon, performing a solid phase epitaxy, and performing a laser anneal to the embedded silicon-carbon band. Moreover, a nitride layer 122 is deposited around the sacrificial gate stack 120 using a replacement gate process flow; and, chemical mechanical polishing (CMP) is performed on the nitride layer 122.

Many of the details of forming STI regions, channel regions, gate stacks, silicon-carbon layers, etc., are well-known and are not discussed herein in detail so as to focus the reader on the salient portions of the invention. Instead, reference is made to U.S. Pat. No. 6,844,227 to Kubo et al. and U.S. Pat. No. 7,138,292 to Mirabedini et al. for the description of such details and the same are fully incorporated herein by reference.

Figure 2:
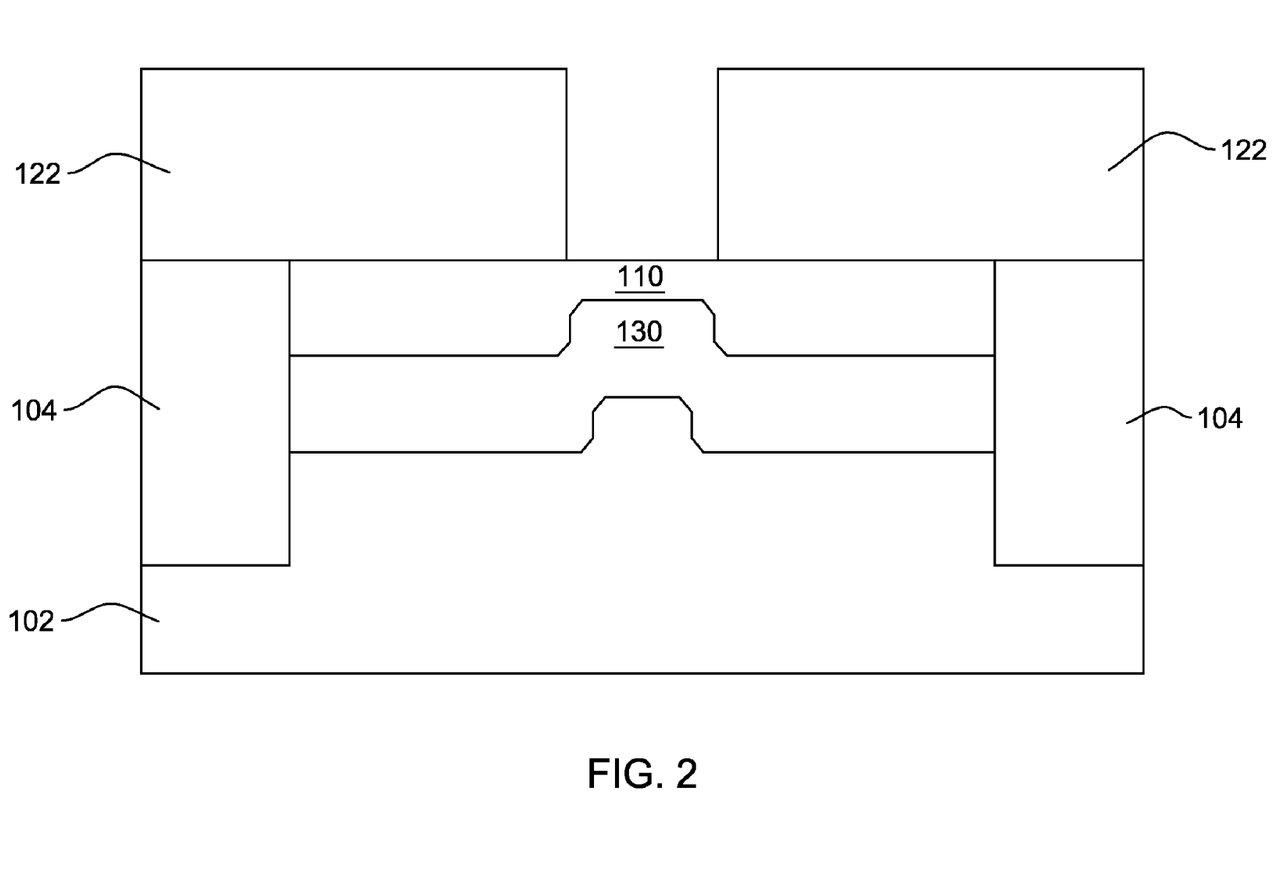
FIG. 2 is a diagram illustrating an incomplete field effect transistor wherein the sacrificial gate stack is removed.
Figure 3:
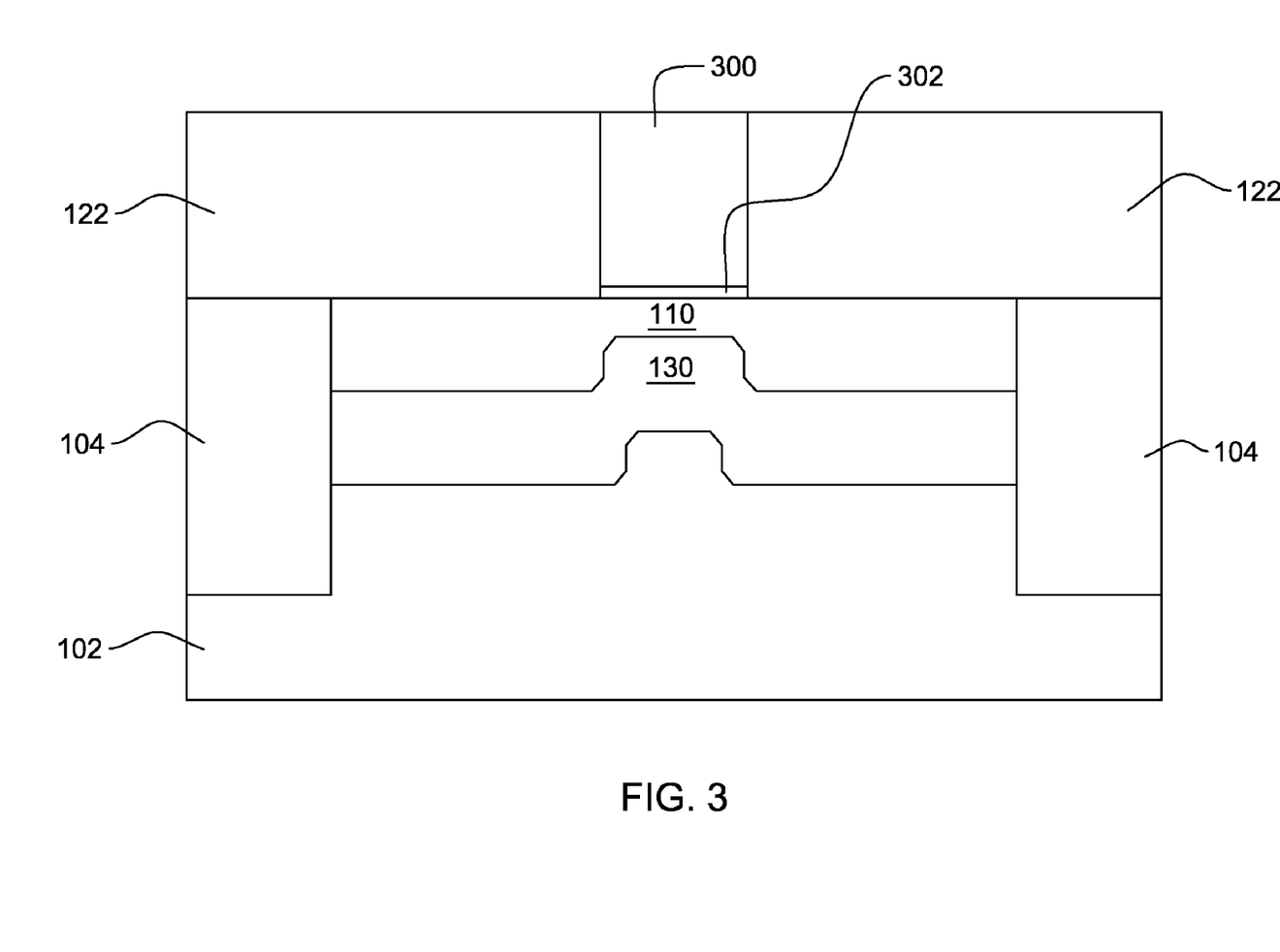
FIG. 3 is a diagram illustrating an incomplete field effect transistor having a gate and a nitride layer.

The sacrificial gate stack 120 is then removed (FIG. 2). Following this, the method forms a gate 300 in the area above the channel region 110 vacated by the sacrificial gate stack 120 (FIG. 3). Specifically, high-k gate dielectrics or other low temperature processes is performed to form the gate 300. The gate 300 includes a gate oxide 302.

Figure 4:
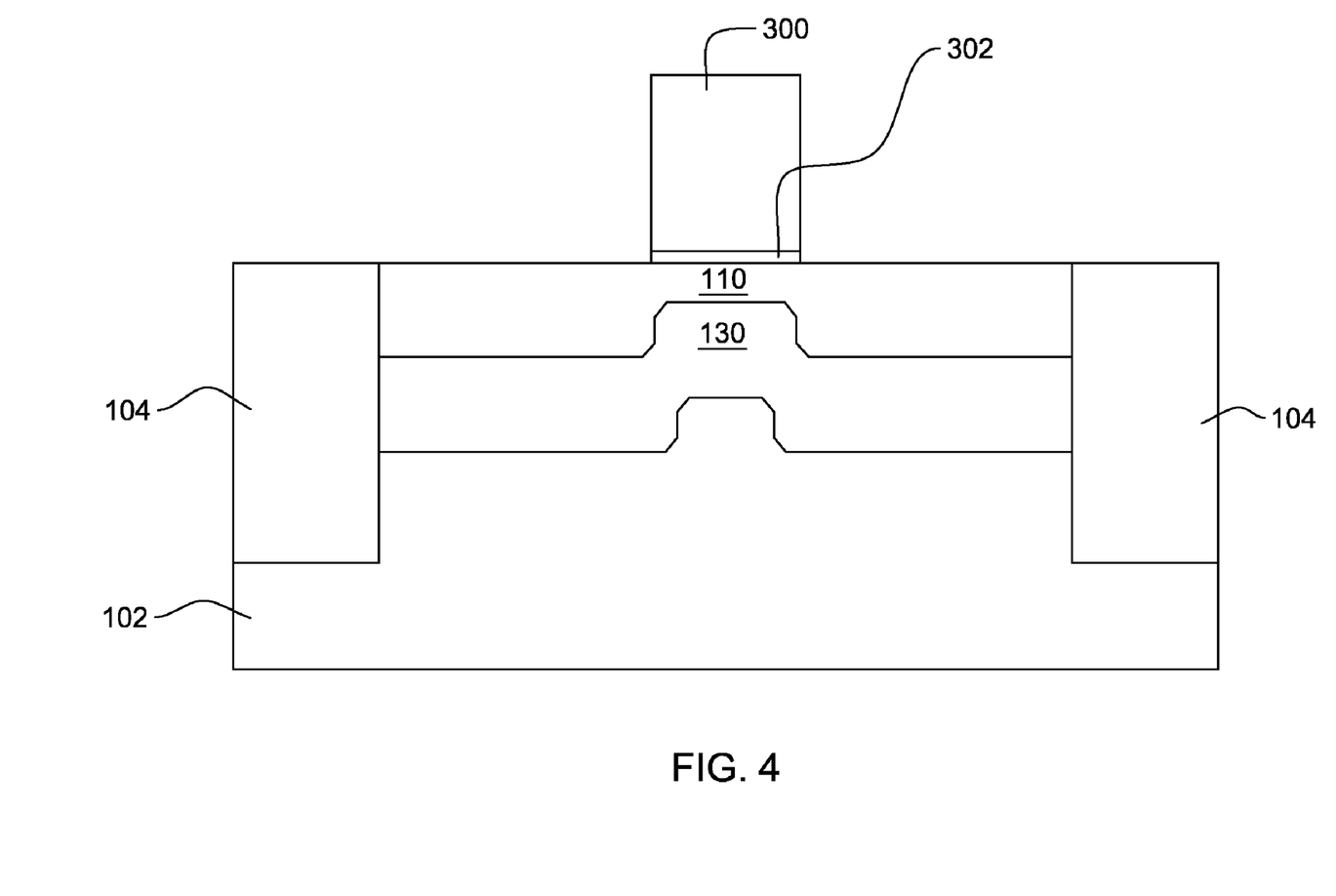
FIG. 4 is a diagram illustrating an incomplete field effect transistor wherein the nitride layer is removed.
Figure 5:
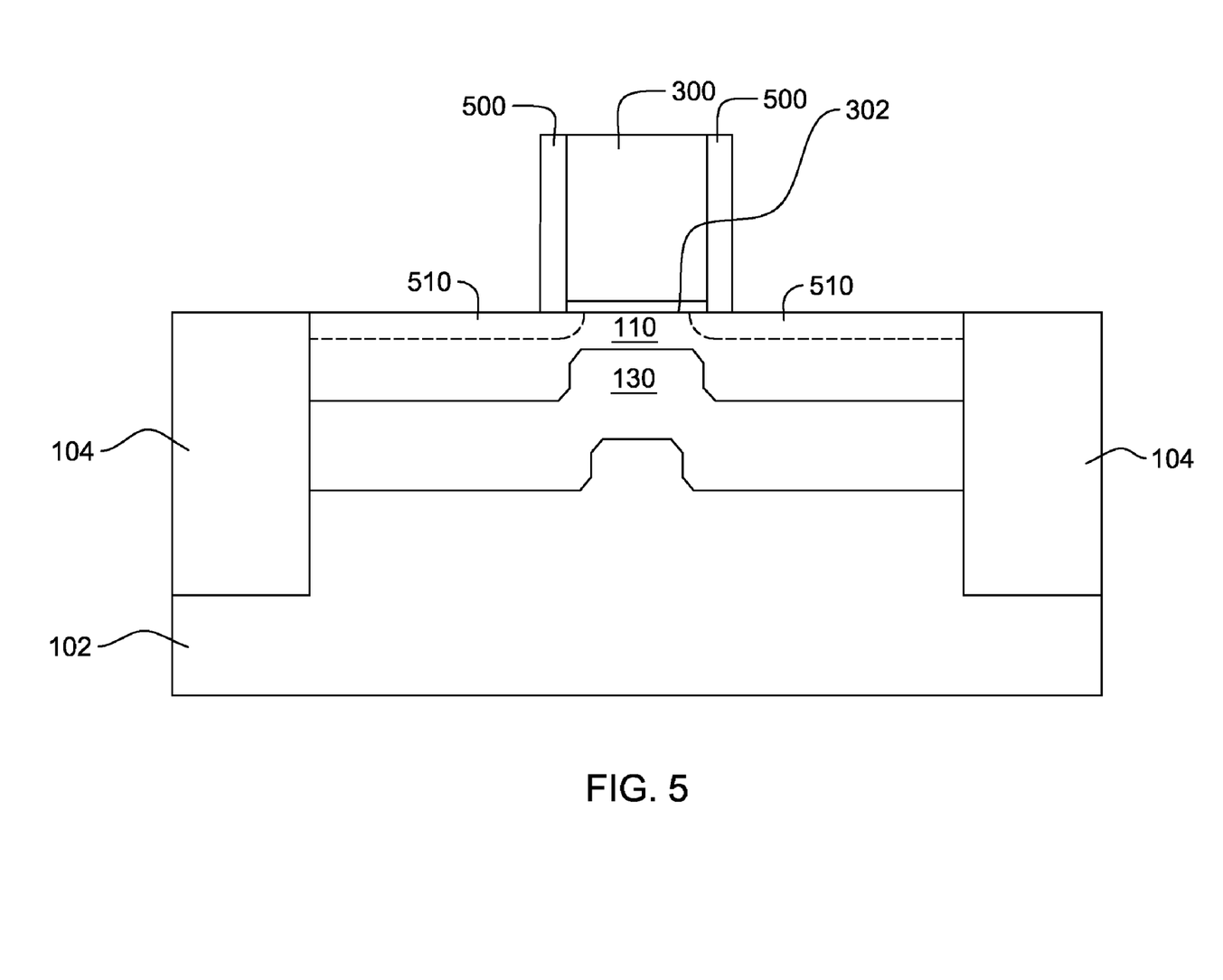
FIG. 5 is a diagram illustrating an incomplete field effect transistor having offset spacers.
Figure 6:
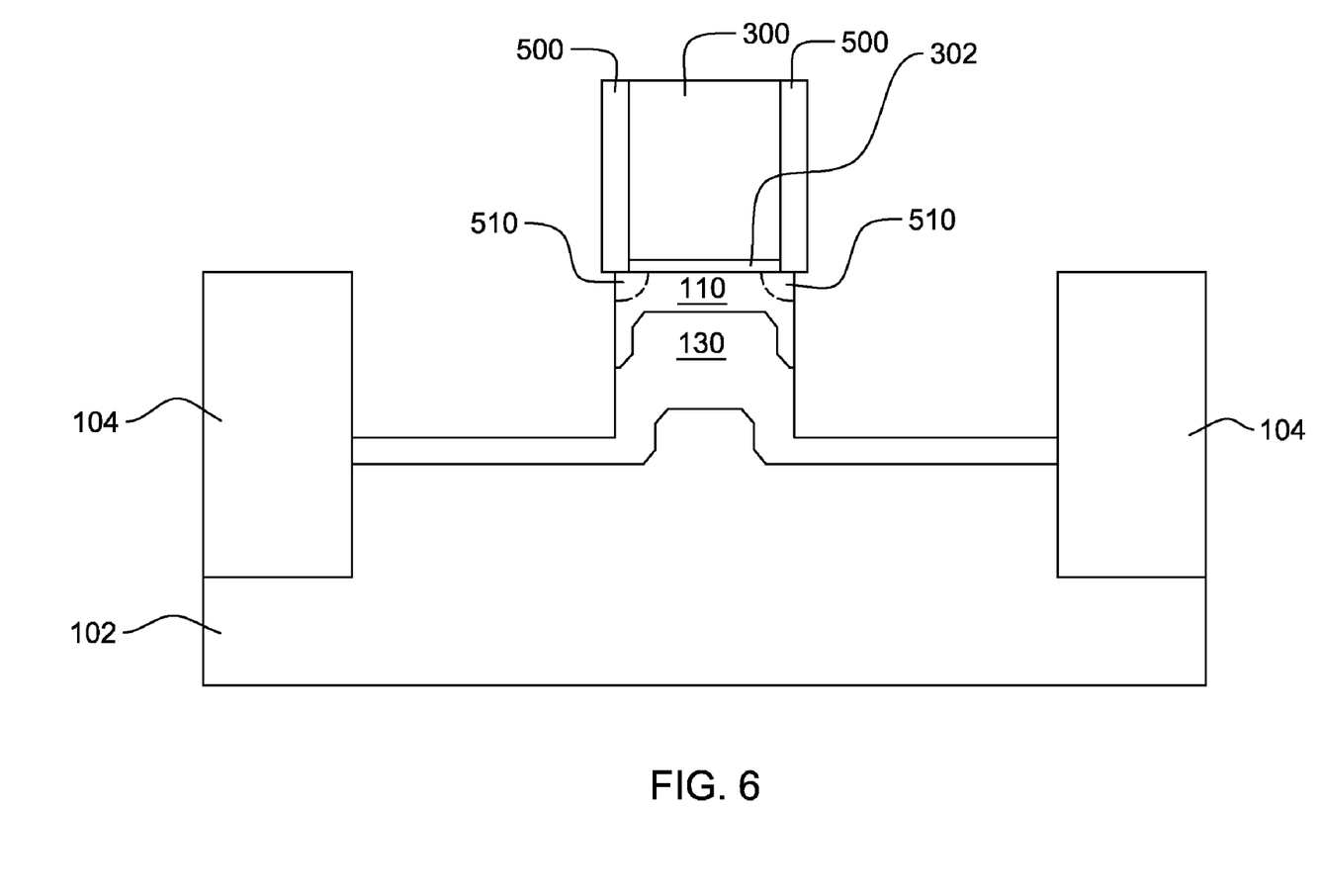
FIG. 6 is a diagram illustrating an incomplete field effect transistor after an etching process.

Subsequently, the nitride layer 122 is removed (FIG. 4); and, offset spacers 500 are formed on the gate 300 (FIG. 5). Furthermore, halo/extenstion regions 510 are implanted on opposite sides of the channel region 110. Additionally, as illustrated in FIG. 6, the substrate 102 is etched in areas between the channel region 110 and the STI regions 104. This removes portions of the silicon-carbon layer 130 that are not beneath the channel region 110.

Figure 7:
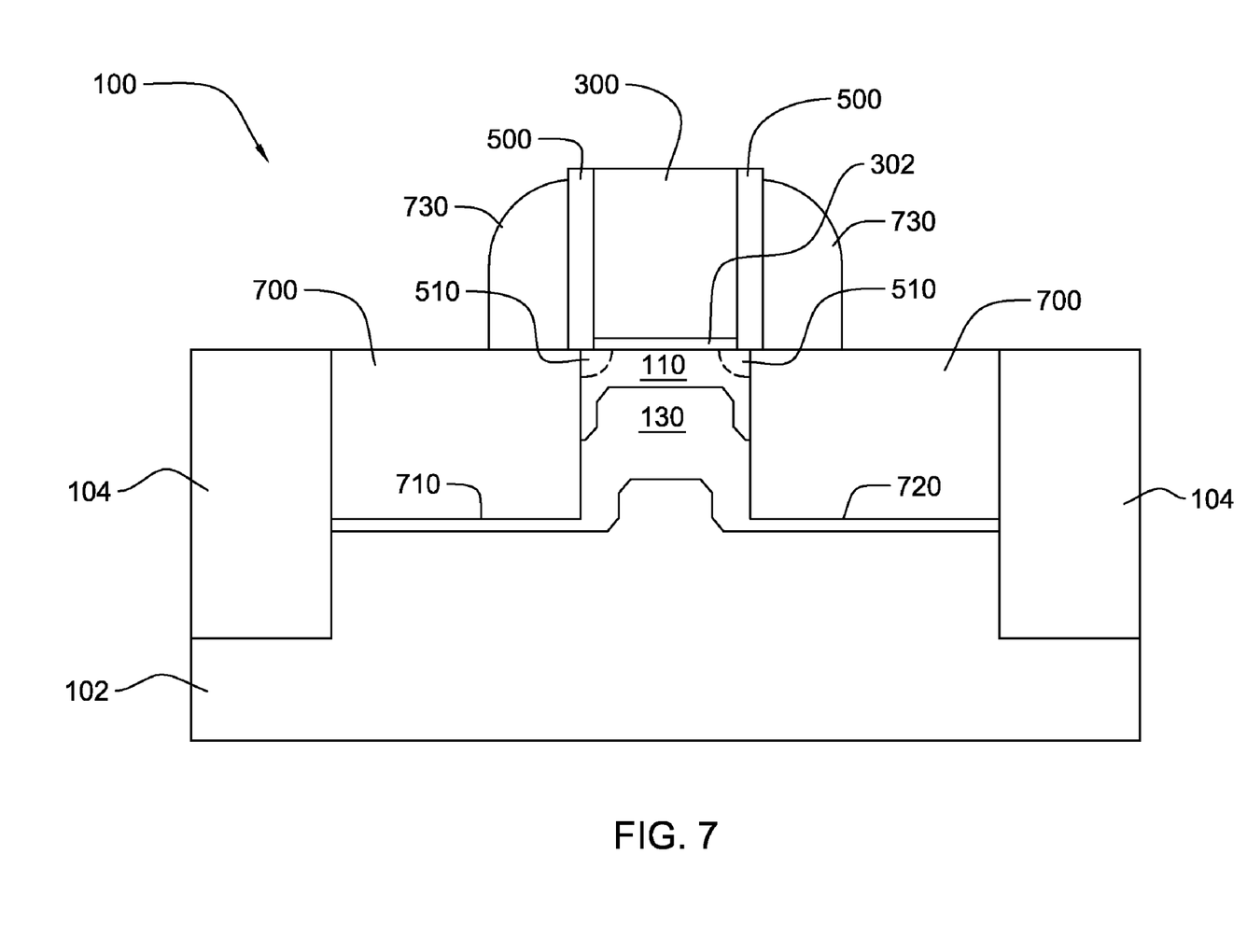
FIG. 7 is a diagram illustrating a completed field effect transistor.

As illustrated in FIG. 7, the method then epitaxially grows silicon germanium regions 700 in etched areas of the substrate 102. Further, a source region 710 and a drain region 720 are formed in areas opposite the sides of the channel region 110. The source region 710 and the drain region 720 include portions of the silicon germanium regions 700 and portions of the silicon-carbon layer 130. In addition, spacers 730 are formed on the offset spacers 500.

Figure 8:
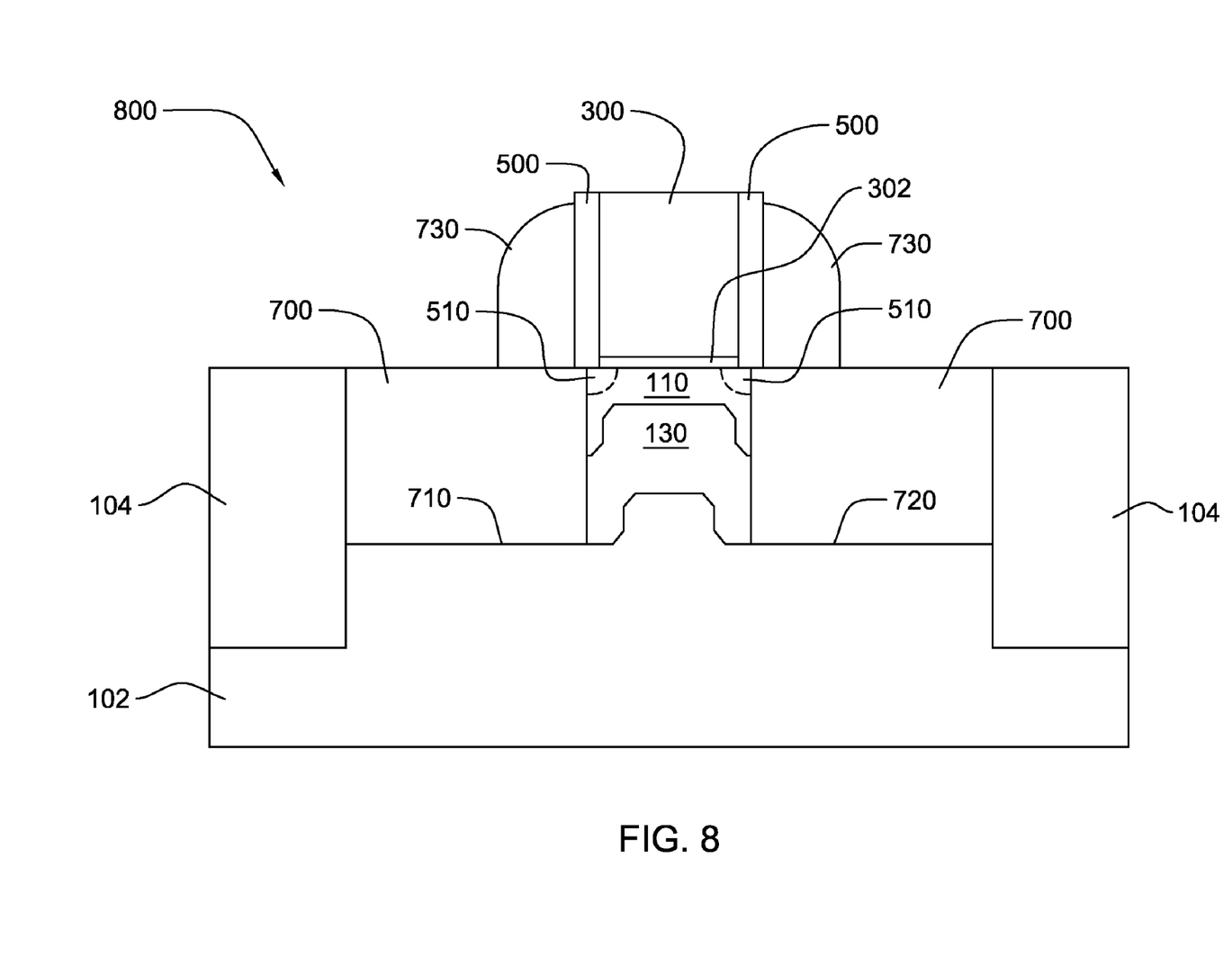
FIG. 8 is a diagram illustrating a completed field effect transistor lacking silicon-carbon in source and drain regions.
Figure 9:
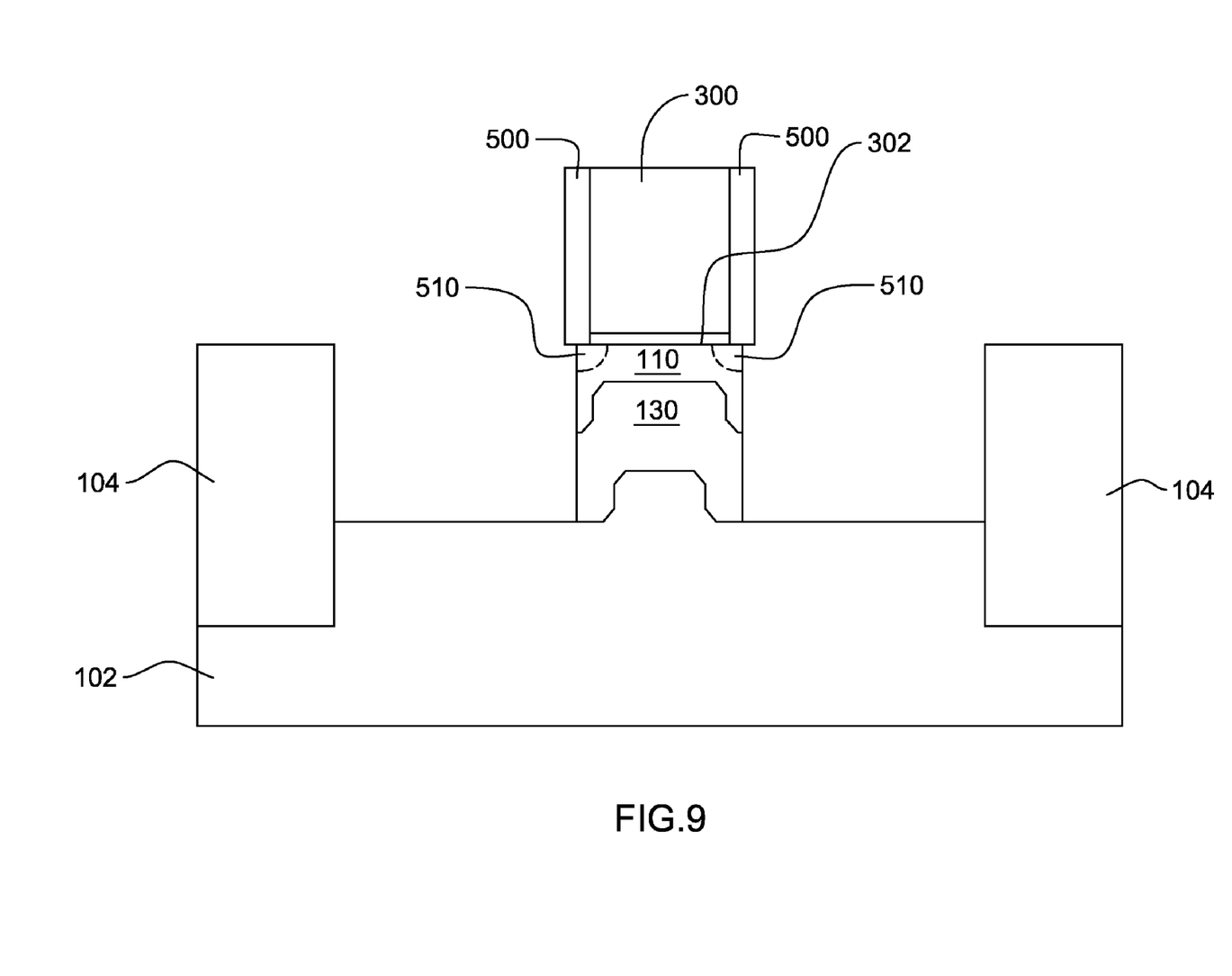
FIG. 9 is a diagram illustrating an incomplete field effect transistor after a deep etching process.

As illustrated in FIG. 8, a field effect transistor 800 is provided, wherein the source region 710 and the drain region 720 lack silicon-carbon. The field effect transistor 800 utilizes the same process to fabricate the field effect transistor 100; however, the process to form the field effect transistor 800 performs a deep recess in the substrate 102 before growing the silicon germanium regions 700 to totally remove portions of the silicon-carbon layer 130 from areas opposite the sides of the channel region 110 (FIG. 9).

Figure 10:
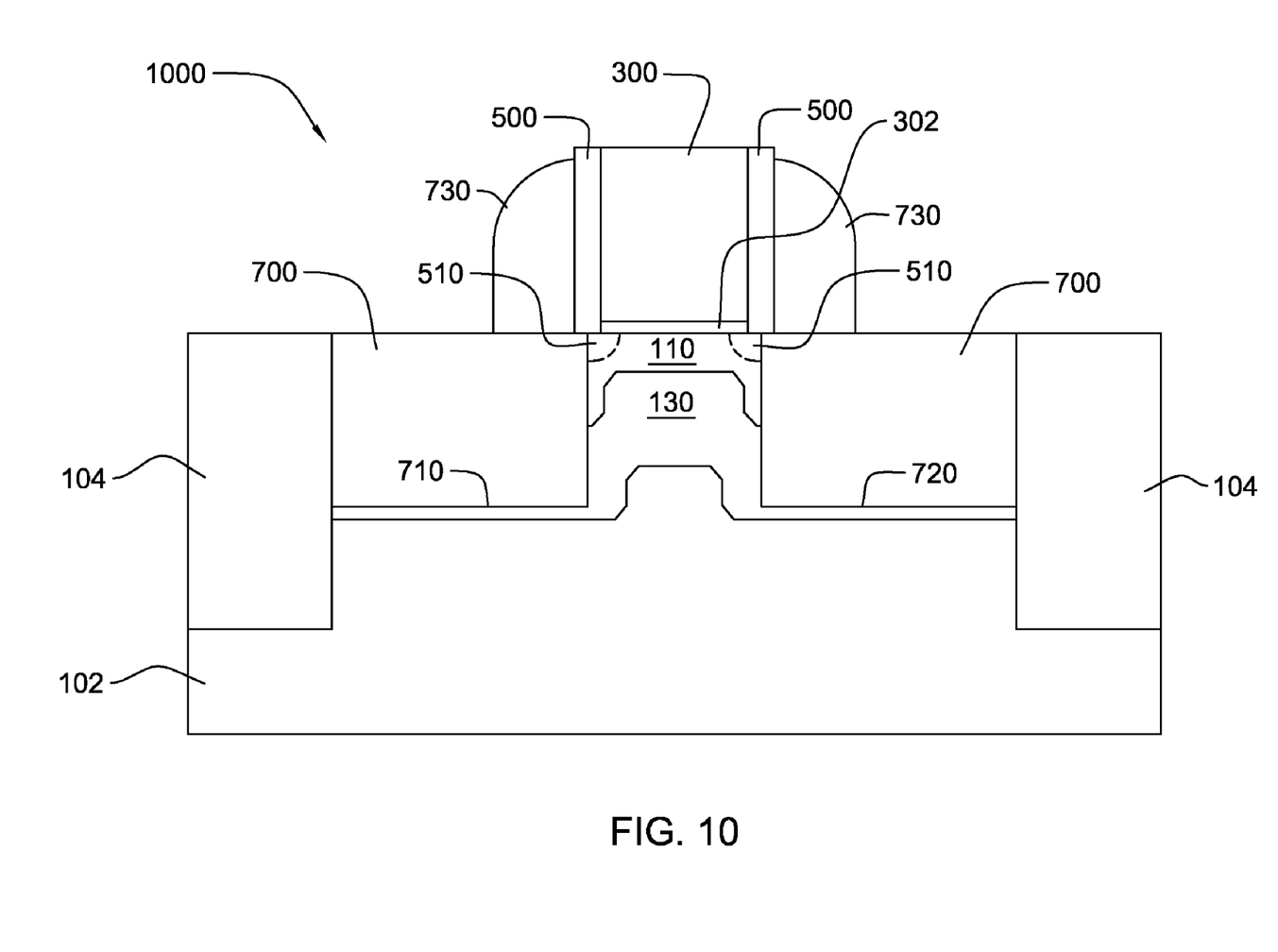
FIG. 10 is a diagram illustrating a completed field effect transistor having a silicon-carbon layer having a flatter uppermost surface.
Figure 11:
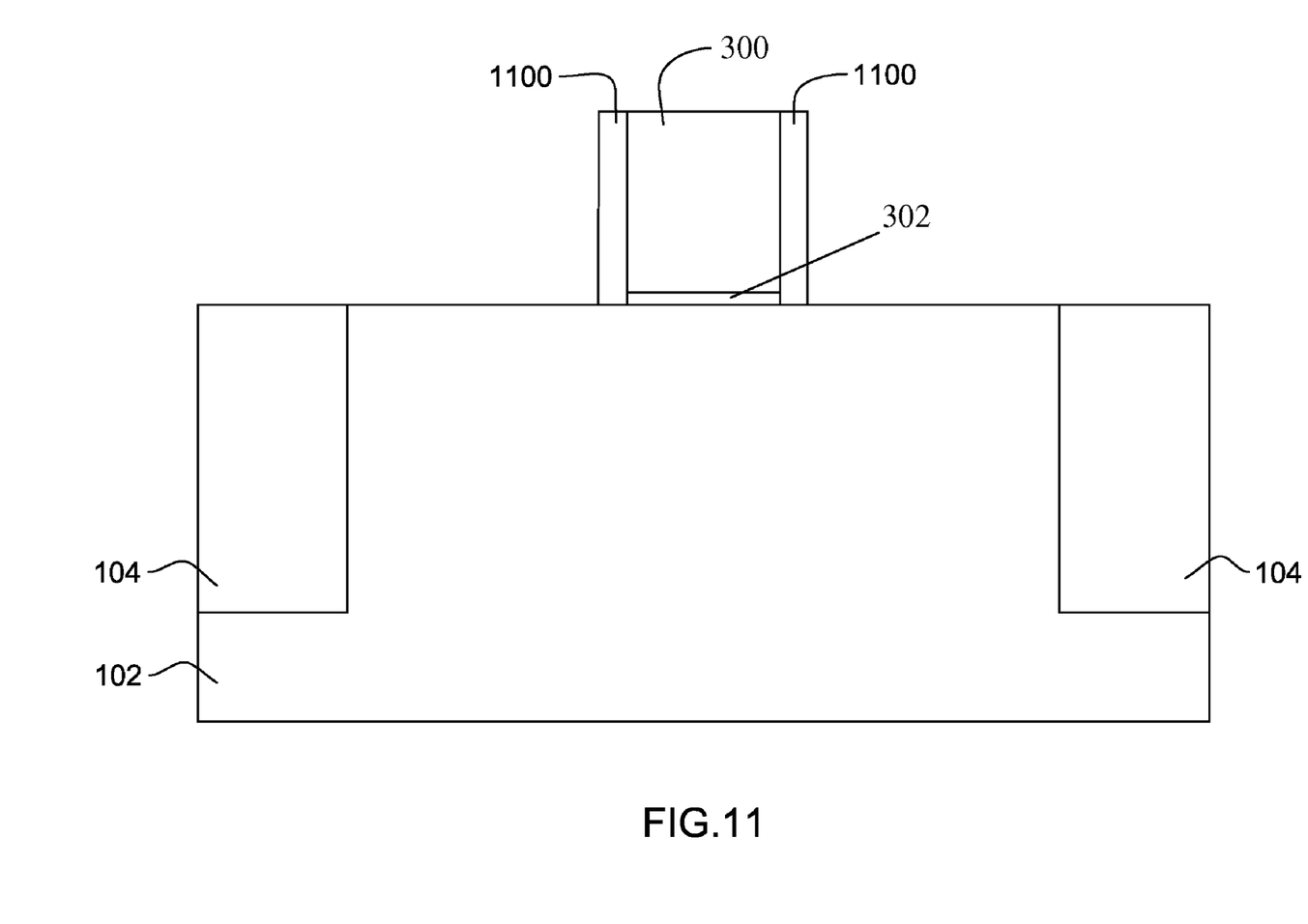
FIG. 11 is a diagram illustrating an incomplete field effect transistor having sacrificial spacers.

As illustrated in FIG. 10, a field effect transistor 1000 is also provided, wherein an uppermost surface of the silicon-carbon layer 130 in the field effect transistor 1000 is flatter (less rounded) than the silicon-carbon layer 130 in the field effect transistor 100. The process of forming the field effect transistor 1000 is similar to the process of fabricating the field effect transistor 100; however, sacrificial spacers 1100 are formed on the gate 300 prior to forming the silicon-carbon layer 130 (FIG. 11).

Figure 12:
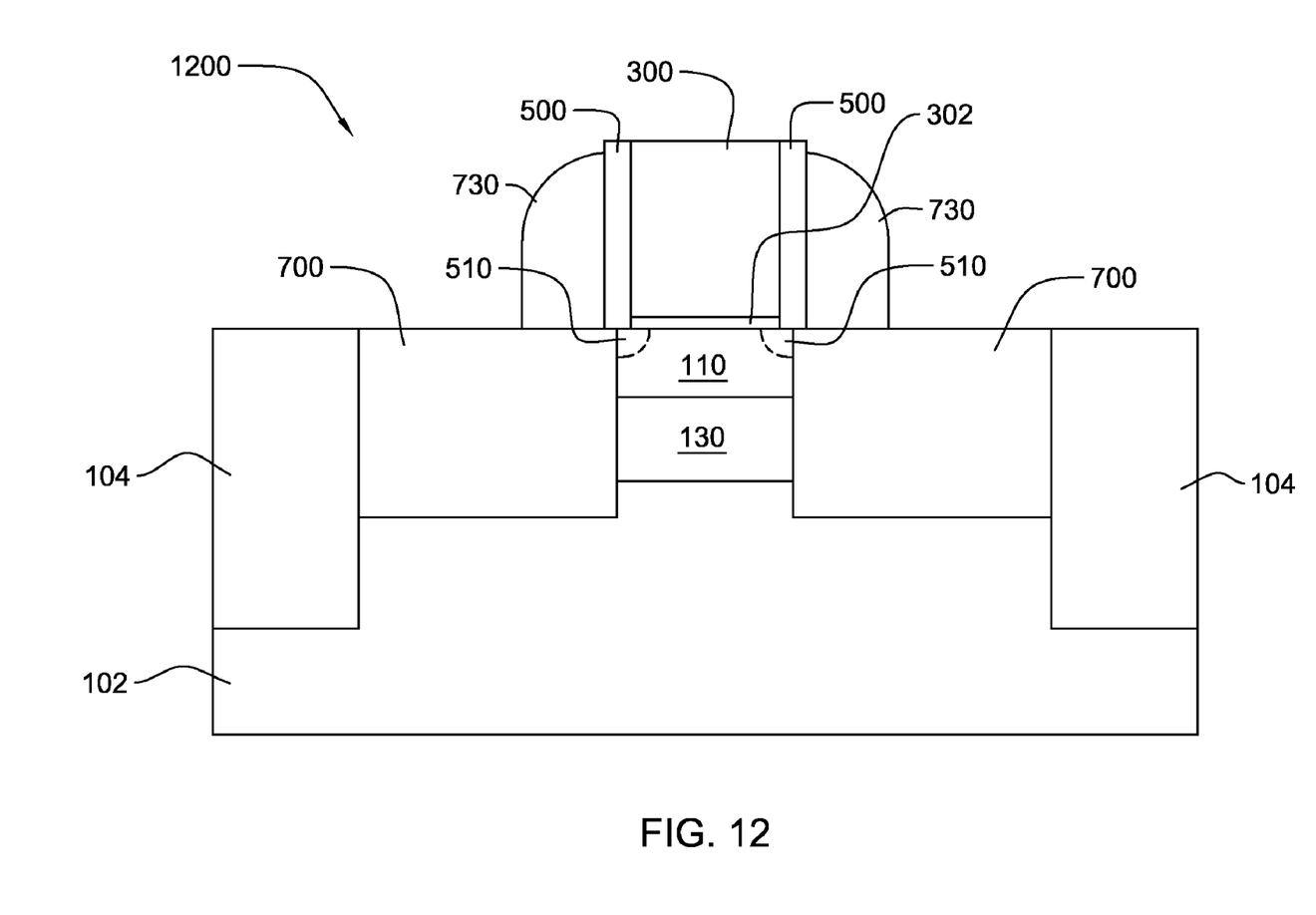
FIG. 12 is a diagram illustrating a completed field effect transistor having a rectangular-shaped silicon-carbon layer.
Figure 13:
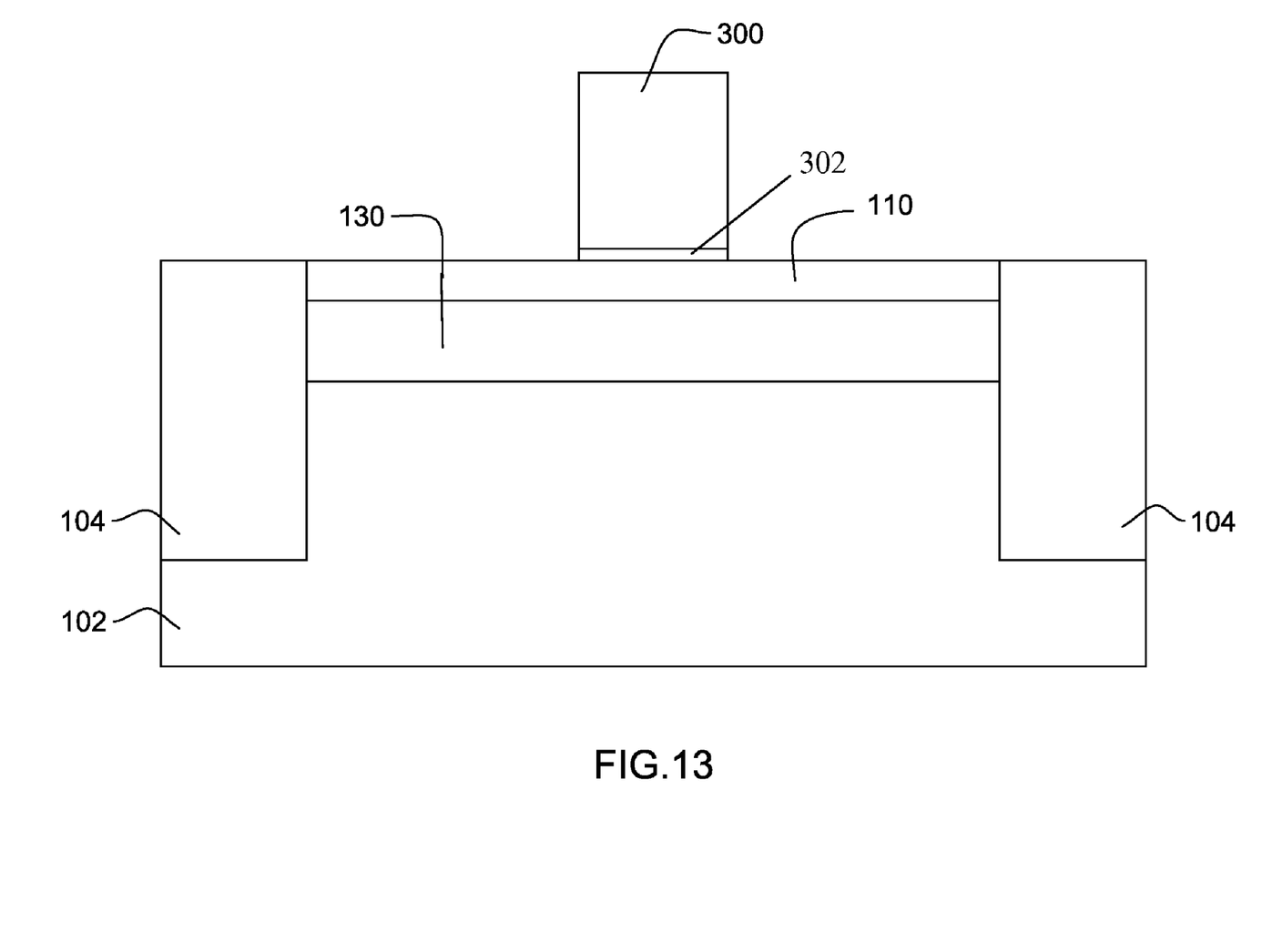
FIG. 13 is a diagram illustrating an incomplete field effect transistor having a rectangular-shaped silicon-carbon layer.

As illustrated in FIG. 12, a field effect transistor 1200 is also provided having a rectangular-shaped silicon-carbon layer 130. The process of forming the field effect transistor 1200 is similar to the process of fabricating the field effect transistor 100; however, the silicon-carbon layer 130 is formed having a rectangular shape (FIG. 13). Following this, the gate 300 is formed above the channel region 110.

The embodiments of the invention comprise a self-aligned super stressed PFET. More specifically, a field effect transistor comprises a channel region comprising N-doped material and a gate above the channel region. As illustrated in FIG. 1, the channel region 110 is between the STI regions 104, wherein the sacrificial gate stack 120 is formed above the channel region 110. The field effect transistor also includes a source region on a first side of the channel region and a drain region on a second side of the channel region opposite the first side. The source and drain regions each comprise silicon germanium, wherein the silicon germanium has structural indicia of epitaxial growth. As described above, the silicon germanium regions 700 are epitaxially grown in the etched areas of the substrate 102.

Furthermore, a silicon-carbon layer is below the channel region, the source region, and the drain region. It is recognized that the silicon-carbon layer can be positioned only below the channel region and not below the source and drain regions. As described above, the implantation of the silicon-carbon layer includes performing a pre-amorphization implantation (PAI) with germanium (Ge), xenon (Xe), silicon (Si), arsenic (As) or other species. Carbon implantation, a solid phase epitaxy, and a laser anneal are also performed The silicon-carbon layer is thicker below the channel region relative to areas of the silicon-carbon layer below the source and drain regions (there maybe no Si:C layer in the source/drain regions at all, as shown in FIG. 8). Moreover, a thickness of the silicon-carbon layer below the source region is less than a thickness of the silicon germanium of the source region; and, a thickness of the silicon-carbon layer below the drain region is less than a thickness of the silicon germanium of the drain region.

The silicon-carbon layer comprises when viewed in cross-section, an inverted U-shaped structure. More specifically, this includes a horizontal portion, a first vertical portion positioned at a first end of the horizontal portion, and a second vertical portion positioned at a second end of the horizontal portion opposite the first end of the horizontal portion. The first vertical portion and the second vertical portion are positioned below an uppermost surface of the silicon-carbon layer. As illustrated in FIG. 10, the silicon-carbon layer 130 could have a relatively flat (less rounded) uppermost surface.

Further, as illustrated in FIG. 12, it is contemplated that the silicon-carbon layer 130 could be rectangular-shaped.

Figure 14:
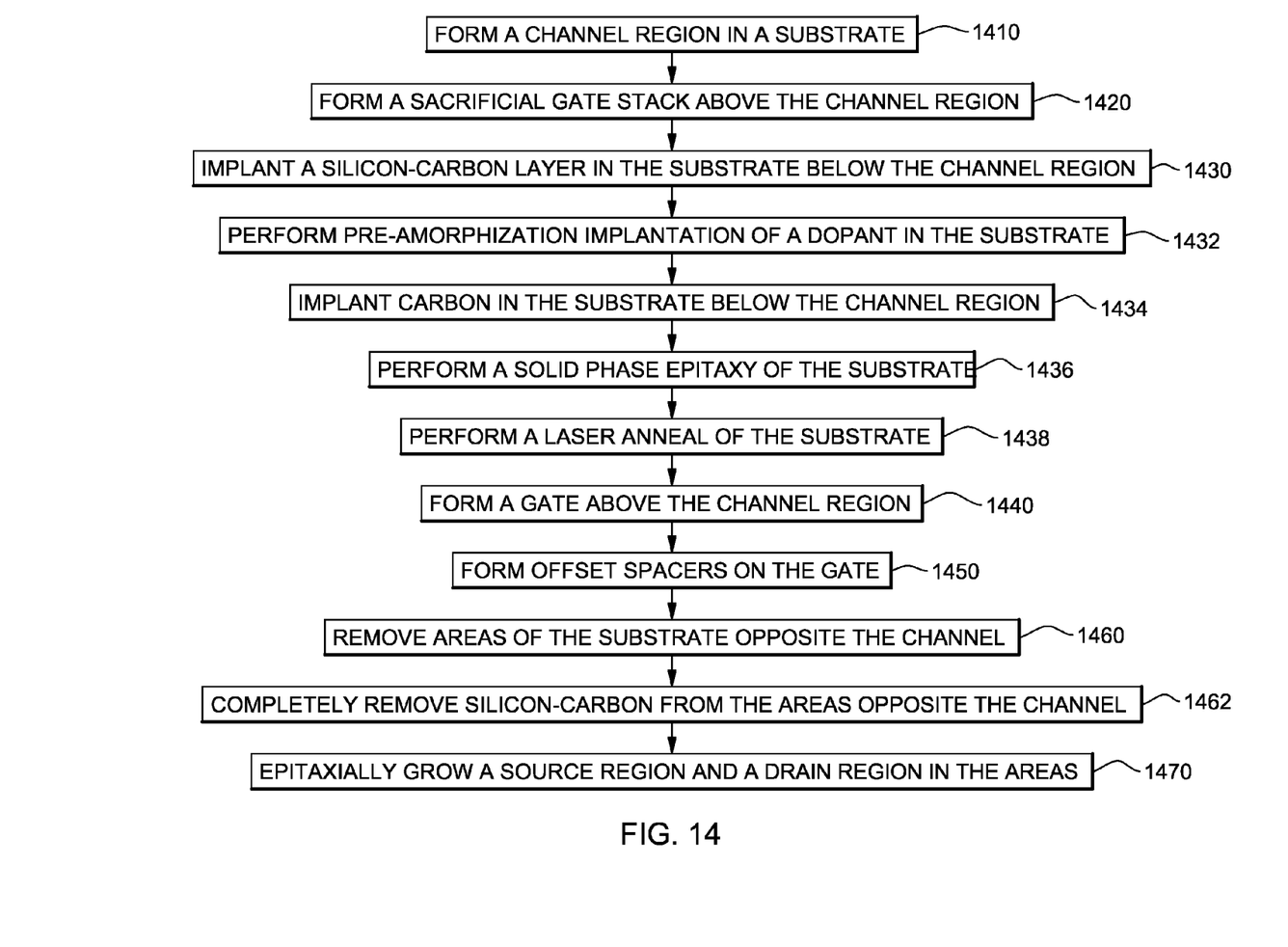
FIG. 14 is a flow diagram illustrating a method of forming a field effect transistor.

In addition, the embodiments of the invention include a method of forming a self-aligned super stressed PFET. The method begins by forming a channel region in a substrate (item 1410) and forming a sacrificial gate stack above the channel region (item 1420). Next, a silicon-carbon layer is implanted in the substrate below the channel region (item 1430). This includes performing pre-amorphization implantation of a dopant in the substrate (item 1432) and implanting carbon in the substrate below the channel region (item 1434). The implanting of the silicon-carbon layer also includes performing solid phase epitaxy of the substrate (item 1436) and a laser anneal of the substrate (item 1438). As described above, a nitride layer can be deposited around the sacrificial gate stack using a replacement gate process flow, wherein chemical mechanical polishing (CMP) is performed on the nitride layer.

The method also forms a gate above the channel region (item 1440) and forms offset spacers on the gate (item 1450). As described above, high-k gate dielectrics or other low temperature processes is performed to form the gate, wherein the gate could includes a gate oxide. Following this, areas of the substrate opposite the channel are removed (item 1460) and a source region and a drain region are epitaxially grown in the areas (item 1470). The removing of the areas of the substrate opposite the channel can include completely removing silicon-carbon from the areas opposite the channel (item 1462). As described above, the source and drain regions can each include portions of the silicon germanium regions and portions of the silicon-carbon layer, or no silicon-carbon layer in source/drain at all. Subsequently, spacers are formed above the source and drain regions (item 1470).

Accordingly, the embodiments of the invention provide self-aligned structures having a carbon-doped silicon layer under the PFET channel and silicon germanium in the recessed source and drain regions. This inserts ultra compressive strain into the PFET channel for device performance improvement. Moreover, the carbon-doped silicon layer can help retard B diffusion, therefore to improve threshold voltage roll-off. Furthermore, the carbon-doped silicon layer can help improve silicon germanium epitaxial quality.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A field effect transistor, comprising:
a channel region;
a gate above said channel region;
a source region comprising silicon germanium on a first side of said channel region;
a drain region comprising silicon germanium on a second side of said channel region opposite said first side,
wherein said silicon germanium of said source region and of said drain region does not extend beneath said gate; and
a silicon-carbon layer below said channel region, said source region, and said drain region,
wherein a portion of said silicon-carbon layer below said channel region comprises when viewed in cross-section:
a horizontal portion,
a first vertical portion positioned at a first end of said horizontal portion, and
a second vertical portion positioned at a second end of said horizontal portion opposite said first end of said horizontal portion,
wherein said first vertical portion and said second vertical portion are positioned below an uppermost surface of said silicon-carbon layer.

2. A field effect transistor, comprising:
a channel region;
a gate above said channel region;
a source region comprising silicon germanium on a first side of said channel region;
a drain region comprising silicon germanium on a second side of said channel region opposite said first side,
wherein said silicon germanium of said source region and of said drain region does not extend beneath said gate; and
a silicon-carbon layer positioned only below said channel region,
wherein said silicon-carbon layer comprises when viewed in cross-section:
a horizontal portion,
a first vertical portion positioned at a first end of said horizontal portion, and
a second vertical portion positioned at a second end of said horizontal portion opposite said first end of said horizontal portion,
wherein said first vertical portion and said second vertical portion are positioned below an uppermost surface of said silicon-carbon layer.

3. A field effect transistor, comprising:
a channel region;
a gate above said channel region;
a source region comprising silicon germanium on a first side of said channel region;
a drain region comprising silicon germanium on a second side of said channel region opposite said first side; and
a silicon-carbon layer positioned only below said channel region, wherein said silicon-carbon layer comprises when viewed in cross-section:
a horizontal portion,
a first vertical portion positioned at a first end of said horizontal portion, and
a second vertical portion positioned at a second end of said horizontal portion opposite said first end of said horizontal portion,
wherein said first vertical portion and said second vertical portion are positioned below an uppermost surface of said silicon-carbon layer.

4. The field effect transistor according to claim 1, wherein said silicon-carbon layer is thicker below said channel region relative to areas of said silicon-carbon layer below said source region and said drain region.

5. The field effect transistor according to claim 1, wherein a thickness of said silicon-carbon layer below said source region is less than a thickness of said silicon germanium of said source region, and wherein a thickness of said silicon-carbon layer below said drain region is less than a thickness of said silicon germanium of said drain region.

6. The field effect transistor according to claim 1, wherein said silicon germanium comprises structural indicia of epitaxial growth.

7. The field effect transistor according to claim 1, wherein said channel region comprises N-doped material.

8. The field effect transistor according to claim 2, wherein said silicon germanium comprises structural indicia of epitaxial growth.

9. The field effect transistor according to claim 2, wherein said channel region comprises N-doped material.

10. The field effect transistor according to claim 3, wherein said horizontal portion, said first vertical portion, and said second vertical portion of said silicon-carbon layer form an inverted U-shaped structure.

11. The field effect transistor according to claim 3, wherein said channel region comprises N-doped material.

12. The field effect transistor according to claim 11, wherein said channel region further comprises halo/extension regions adjacent to top regions of said silicon germanium on said first side and said second side.

\* \* \* \* \*